United States Patent
Kim et al.

(10) Patent No.: US 8,974,704 B2
(45) Date of Patent: Mar. 10, 2015

(54) PASTE COMPOSITION FOR SOLAR CELL ELECTRODE, ELECTRODE PREPARED USING THE SAME, AND SOLAR CELL COMPRISING THE SAME

(71) Applicants: Eun Kyung Kim, Uiwang-si (KR); Young Wook Choi, Uiwang-si (KR); Hun Gyu Song, Uiwang-si (KR); Jung Chul Lee, Uiwang-si (KR)

(72) Inventors: Eun Kyung Kim, Uiwang-si (KR); Young Wook Choi, Uiwang-si (KR); Hun Gyu Song, Uiwang-si (KR); Jung Chul Lee, Uiwang-si (KR)

(73) Assignee: Cheil Industries, Inc., Gumi-si, Kyeongsangbuk-do (KR)

(*) Notice: Subject to any disclaimer, the term of this patent is extended or adjusted under 35 U.S.C. 154(b) by 0 days.

(21) Appl. No.: 13/792,547

(22) Filed: Mar. 11, 2013

(65) Prior Publication Data
US 2014/0042375 A1 Feb. 13, 2014

(30) Foreign Application Priority Data
Aug. 13, 2012 (KR) .................. 10-2012-0088408

(51) Int. Cl.
*H01B 1/22* (2006.01)
*H01L 31/0224* (2006.01)
*C03C 8/10* (2006.01)
*C03C 8/16* (2006.01)
*C03C 8/18* (2006.01)

(52) U.S. Cl.
CPC .......... *H01L 31/022425* (2013.01); *C03C 8/10* (2013.01); *C03C 8/16* (2013.01); *C03C 8/18* (2013.01); *H01B 1/22* (2013.01)
USPC ............................ 252/512; 252/514; 136/252

(58) Field of Classification Search
USPC ............................ 252/512–514; 136/252–256
See application file for complete search history.

(56) References Cited

U.S. PATENT DOCUMENTS

| | | | |
|---|---|---|---|
| 5,183,784 A * | 2/1993 | Nguyen et al. | 501/19 |
| 5,663,109 A * | 9/1997 | Dietz et al. | 501/41 |
| 8,497,420 B2 * | 7/2013 | Carroll et al. | 136/256 |
| 2011/0308595 A1 * | 12/2011 | Carroll et al. | 136/256 |
| 2013/0049148 A1 * | 2/2013 | Hang et al. | 257/431 |

OTHER PUBLICATIONS

USPTO Action mailed Jun. 4, 2014, in U.S. Appl. No. 13/951,600, wherein claims were provisionally rejected on the ground of nonstatutory double patenting over claims of the captioned application.

* cited by examiner

*Primary Examiner* — Mark Kopec
(74) *Attorney, Agent, or Firm* — Lee & Morse, P.C.

(57) ABSTRACT

A paste composition for solar cell electrodes includes a conductive powder, a glass frit, and an organic vehicle. The glass fit includes about 5 wt % to about 55 wt % of $Bi_2O_3$, about 10 wt % to about 40 wt % of $TeO_2$, and a balance of PbO.

11 Claims, 1 Drawing Sheet

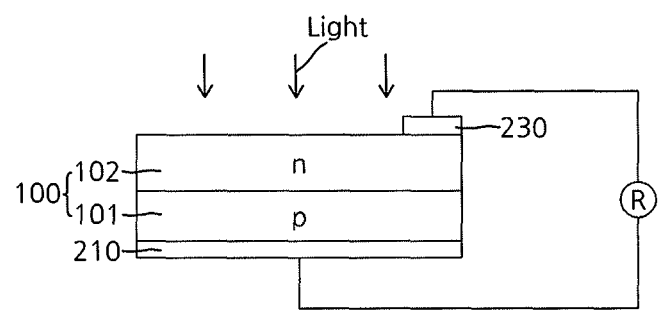

PASTE COMPOSITION FOR SOLAR CELL ELECTRODE, ELECTRODE PREPARED USING THE SAME, AND SOLAR CELL COMPRISING THE SAME

CROSS-REFERENCE TO RELATED APPLICATION

The present application claims priority under 35 U.S.C. §119 to Korean Patent Application No. 10-2012-0088408, filed on Aug. 13, 2012, in the Korean Intellectual Property Office, and entitled "Paste Composition for Solar Cell Electrode, Electrode Prepared Using the Same, and Solar Cell Comprising the Same," which is incorporated by reference herein in its entirety.

BACKGROUND

1. Field

Embodiments relate to a paste composition for solar cell electrodes, an electrode fabricated using the same, and a solar cell including the same.

2. Description of Related Art

Solar cells generate electric energy using the photovoltaic effect of a p-n junction which converts photons of sunlight into electricity. In the solar cell, a front electrode and a rear electrode are formed on front and rear surfaces of a semiconductor wafer or substrate with the p-n junction, respectively. In the solar cell, the photoelectric effect of the p-n junction is induced by sunlight entering the semiconductor wafer, and resultant electrons provide current flowing to the outside through the electrodes. The electrodes of the solar cell are formed on the surface of the wafer by depositing, patterning, and baking a paste composition for electrodes.

SUMMARY

Embodiments are directed to a paste composition for solar cell electrodes including a conductive powder, a glass frit, and an organic vehicle, the glass frit including about 5 wt % to about 55 wt % of $Bi_2O_3$, about 10 wt % to about 40 wt % of $TeO_2$, and a balance of PbO.

A sum of $Bi_2O_3$ and PbO may range from about 20 wt % to about 70 wt % of the glass fit. PbO may be present in an amount of about 10 to about 60 wt % in the glass fit.

The glass frit may further include at least one selected from the group of $Al_2O_3$, $ZrO_2$, $P_2O_5$, ZnO, $SiO_2$, $Na_2O$, $B_2O_3$, $Ta_2O_5$, $Fe_2O_3$, $Cr_2O_3$, $Co_2O_3$, $Li_2O$, $Li_2CO_3$, MgO, and $MnO_2$. The glass fit may have an average particle diameter (D50) of about 0.1 to about 5 µm.

The conductive powder may include at least one selected from the group of silver (Ag), gold (Au), palladium (Pd), platinum (Pt), copper (Cu), chromium (Cr), cobalt (Co), aluminum (Al), tin (Sn), lead (Pb), zinc (Zn), iron (Fe), iridium (Ir), osmium (Os), rhodium (Rh), tungsten (W), molybdenum (Mo), nickel (Ni), magnesium (Mg) and indium tin oxide (ITO).

The organic vehicle may include a cellulose polymer, an acrylic copolymer, a polyvinyl resin, a solvent, or a mixture thereof.

The paste may include about 60 wt % to about 90 wt % of the conductive powder, about 1 wt % to about 10 wt % of the glass fit, and about 7 wt % to about 30 wt % of the organic vehicle.

The additive may include at least one additive selected from the group of dispersants, thixotropic agents, plasticizers, viscosity stabilizers, antifoaming agents, pigments, UV stabilizers, antioxidants, and coupling agents.

An electrode may be prepared from the paste composition for solar cell electrodes. A solar cell may include the electrode as claimed in claim 1

BRIEF DESCRIPTION OF DRAWING

Features will become apparent to those of ordinary skill in the art by describing in detail exemplary embodiments with reference to the attached drawing in which:

FIG. 1 illustrates a schematic view of a solar cell manufactured using a paste in accordance with an exemplary embodiment.

DETAILED DESCRIPTION

Example embodiments will now be described more fully hereinafter with reference to the accompanying drawing; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figure, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

According to embodiments, a paste composition for solar cell electrodes may include a conductive powder, a glass frit, and an organic vehicle.

In one embodiment, the paste may include about 60 wt % to about 90 wt % of the conductive powder, about 1 wt % to about 10 wt % of the glass fit, and about 7 wt % to about 30 wt % of the organic vehicle.

Conductive Powder

The conductive powder may include silver (Ag), gold (Au), palladium (Pd), platinum (Pt), copper (Cu), chromium (Cr), cobalt (Co), aluminum (Al), tin (Sn), lead (Pb), zinc (Zn), iron (Fe), iridium (Ir), osmium (Os), rhodium (Rh), tungsten (W), molybdenum (Mo), nickel (Ni), magnesium (Mg) or indium tin oxide (ITO). These conductive powders may be used alone, as mixtures, or as alloys. In an implementation, the conductive powder may include silver particles and may further include Ni, Co, Fe, Zn, or Cu.

The conductive powder may have a spherical, flake, or amorphous shape. The conductive powder may be a mixture of conductive powders having different particle shapes.

The conductive powder may have an average particle diameter (D50) of about 0.1 µm to about 3 µm. The average particle diameter may be measured using, for example, a Model 1064D particle size analyzer (CILAS Co., Ltd.) after dispersing the conductive powder in isopropyl alcohol (IPA) at 25° C. for 3 minutes via ultrasonication. Within this range, the electrode paste may have reduced contact resistance and linear resistance. For example, the average particle diameter may range from about 0.5 µm to about 2 µm. The conductive powder may include a mixture of conductive powders having different average particle diameters.

The conductive powder may be present in an amount of about 60 wt % to about 90 wt % in the paste composition. Within this range, the conductive powder may prevent or reduce the occurrence of deterioration in conversion efficiency of a solar cell due to resistance increase and may reduce or avoid difficulty in forming the paste that could be caused by a relative reduction in amount of the organic vehicle. For example, the conductive powder may be present in an amount of about 70 wt % to about 88 wt %.

Glass Frit

The glass frit serves to enhance adhesion of the conductive powder with respect to the wafer or the substrate and to generate crystals of the conductive powder in an emitter region by etching an anti-reflection layer and melting the conductive powder so as to reduce contact resistance during a baking process of the paste.

The glass frit may be three-component glass frit ($PbO$—$Bi_2O_3$—$TeO_2$) including $PbO$, $Bi_2O_3$ and $TeO_2$. The glass frit may include about 5 wt % to about 55 wt % of $Bi_2O_3$, about 10 wt % to about 40 wt % of $TeO_2$, and the balance of PbO.

If the amount of $Bi_2O_3$ is 5 wt % or greater, a deterioration of contact resistance may be reduced or avoided. If the amount of $Bi_2O_3$ is 55 wt % or less, damage to a junction by the electrode paste may be reduced or avoided. For example, $Bi_2O_3$ may be included in an amount of about 6 wt % to about 52 wt % in the glass fit.

If the amount of $TeO_2$ is 10 wt % or greater, a reduction of the solidity of Ag $TeO_2$, and a consequent increase in contact resistance, may be reduced or avoided. If the amount of $TeO_2$ is 40 wt % or less, a weakened reactivity of the paste with a silicon interface due to an excessive amount of $TeO_2$, and a consequent increase in contact resistance, may be avoided. As examples, the amount of $TeO_2$ may be about 30 to about 40 wt %, or about 34 to about 37 wt % in the glass frit.

In the three-component glass frit, the sum of $Bi_2O_3$ and PbO may range from about 20 wt % to about 70 wt % of the glass fit. Within this range, damage to a p-n junction may be minimized and contact resistance may be reduced. As examples, the sum may range from about 30 wt % to about 70 wt %, or from about 30 wt % to about 66 wt % in the glass frit.

In the three-component glass frit, the sum of $Bi_2O_3$ and $TeO_2$ may be, as examples, about 20 to about 90 wt %, or about 40 to 88 wt % of the glass fit.

The three-component glass frit may include the remaining amount of PbO excluding $Bi_2O_3$ and $TeO_2$. For example, the amount of PbO may be about 10 to about 60 wt %. Within this range, stability of the p-n junction may be secured under various levels of sheet resistance while enhancing efficiency of the solar cell.

In addition to PbO, $Bi_2O_3$, and $TeO_2$, the glass frit may further include at least one selected from the group of $Al_2O_3$, $ZrO_2$, $P_2O_5$, ZnO, $SiO_2$, $Na_2O$, $B_2O_3$, $Ta_2O_5$, $Fe_2O_3$, $Cr_2O_3$, $Co_2O_3$, $Li_2O$, $Li_2CO_3$, MgO and $MnO_2$. Compositions of the respective components included in the glass frit may be adjusted in consideration of efficiency or high-temperature stability of an electrode.

The glass frit may include crystalline glass frit or amorphous glass frit and lead glass frit, lead-free glass frit, or a mixture thereof.

The glass frit may be prepared from metal oxides, such as PbO, $Bi_2O_3$ and $TeO_2$, using a general method. For example, PbO, $Bi_2O_3$ and $TeO_2$ may be mixed in the amounts as described above. Mixing may be carried out using a ball mill or a planetary mill. The mixture composition may be melted at about 900° C. to about 1,300° C. and subjected to quenching to about 25° C. The resultant product may be ground with a disc mill or a planetary mill, thereby obtaining a glass fit.

The glass frit may have an average particle diameter (D50) of about 0.1 μm to about 5 μm, for example, about 0.5 μm to about 3 μm. The average particle diameter (D50) may be measured using a Model 1064D (CILAS Co., Ltd.) particle size analyzer after dispersing the conductive powder in isopropyl alcohol (IPA) at 25° C. for 3 minutes via ultrasonication.

The glass frit may be present in an amount of about 1 wt % to about 10 wt % in the paste composition. Within this range, it may be possible to improve sintering properties and adhesion of the conductive powder while preventing deterioration in conversion efficiency due to resistance increase. Further, it may be possible to prevent an excessive amount of glass frit from remaining after baking, which could cause an increase in resistance and deterioration in wettability. For example, the glass frit may be present in an amount of about 1 wt % to about 7 wt % in the paste composition.

Organic Vehicle

The organic vehicle may include an organic binder imparting liquid properties to the paste. Examples of the organic binder may include cellulose polymers, such as ethyl cellulose, hydroxyethyl cellulose, hydroxypropyl cellulose, hydroxyethyl hydroxypropyl cellulose, and the like; acrylic copolymers obtained by copolymerization with hydrophilic acrylic monomers such as carboxylic acid groups; and polyvinyl resins. These binders may be may be used alone or as a mixture of two or more thereof.

The organic vehicle may further include a solvent. In this case, the organic vehicle may be a solution obtained by dissolving the organic binder in the solvent. The organic vehicle may include about 5 wt % to about 40 wt % of the organic binder and about 60 wt % to about 95 wt % of the solvent. For example, the organic vehicle may include about 6 wt % to about 30 wt % of the organic binder and about 70 wt % to about 94 wt % of the solvent.

The solvent may include an organic solvent having a boiling point of about 120° C. or higher. The solvent may be selected from the group of carbitol solvents, aliphatic alcohols, ester solvents, cellosolve solvents and hydrocarbon solvents, which are commonly used in the production of electrodes. Examples of solvents suitable for use in the conductive paste composition may include butyl carbitol, butyl carbitol acetate, methyl cellosolve, ethyl cellosolve, butyl cellosolve, aliphatic alcohols, terpineol, ethylene glycol, ethylene glycol monobutyl ether, butyl cellosolve acetate, texanol, or mixtures thereof.

The organic vehicle may be present in an amount of about 7 wt % to about 30 wt % in the paste composition. Within this range, it may be possible to prevent or reduce the occurrence of an inefficient dispersion or an excessive increase in viscosity after preparation of the paste, which could lead to printing difficulty, and it may be possible to prevent or reduce the occurrence of an increase in resistance and other problems that could occur during the baking process. For example, the organic vehicle may be present in an amount of about 10 wt % to about 15 wt % in the paste composition.

In some embodiments, the paste composition may further include typical additives, as needed, to enhance flow properties, process properties, and stability. The additives may include, for example, dispersants, thixotropic agents, plasticizers, viscosity stabilizers, anti-foaming agents, pigments, UV stabilizers, antioxidants, coupling agents, or mixtures thereof. These additives may be present in an amount of about 0.1 wt % to about 5 wt % in the paste composition, for example.

Another aspect provides an electrode prepared from the electrode paste composition for the solar cell and a solar cell including the same. FIG. 1 shows a solar cell in accordance with an exemplary embodiment.

Referring to FIG. 1, a rear electrode 210 and a front electrode 230 may be formed by printing and baking the paste on a wafer or substrate 100 that includes a p-layer 101 and an n-layer 102, which will serve as an emitter. For example, a preliminary process for preparing the rear electrode 210 may be performed by printing the paste on the rear surface of the wafer 100 and drying the printed paste at about 200~400° C. for about 10~60 seconds. Further, a preliminary process for preparing the front electrode may be performed by printing the paste on the front surface of the wafer and drying the paste. Then, the front and rear electrodes 230, 210 may be formed by baking the wafer at about 400 to 950° C., for example, about 850 to 950° C. for about 30 to 50 seconds.

The following Examples and Comparative Examples are provided in order to highlight characteristics of one or more embodiments, but it is to be understood that the Examples and Comparative Examples are not to be construed as limiting the scope of the embodiments, nor are the Comparative Examples to be construed as being outside the scope of the embodiments. Further, it is to be understood that the embodiments are not limited to the particular details described in the Examples and Comparative Examples.

Components used in the following examples and comparative examples were as follows.

A. Conductive powder: Spherical silver (Ag) powder with an average particle diameter (D50) of 2 μm (AG-4-8, Dowa Hightech Co.)
B. Glass frit: Glass frit including PbO, $Bi_2O_3$, and $TeO_2$
C. Organic vehicle: Ethyl cellulose (STD4, Dow Chemical Co.) and butyl carbitol Examples and Comparative Examples: Preparation of electrode paste PbO, $Bi_2O_3$, and $TeO_2$ were mixed according to compositions listed in Table 1 (unit: wt % or parts by weight), melted at 1,200° C., and quenched at 25° C. The resultant product was ground with a disc mill, thereby obtaining glass fit with an average particle diameter (D50) of 2 μm.

4 parts by weight of the glass frit was mixed with 85 parts by weight of the conductive powder and 11 parts by weight of the organic vehicle, obtained by dissolving 1 part by weight of ethyl cellulose in 10 parts by weight of butyl carbitol at 60° C., followed by mixing and dispersing with a 3-roll kneader, thereby preparing a paste composition for solar cell electrodes.

TABLE 1

|  | PbO | $Bi_2O_3$ | $TeO_2$ | Total |
|---|---|---|---|---|
| Example 1 | 59.2 | 6.7 | 34.1 | 100 |
| Example 2 | 47.6 | 15.8 | 36.6 | 100 |
| Example 3 | 12.8 | 51.3 | 35.9 | 100 |
| Example 4 | 38.9 | 26.0 | 35.1 | 100 |
| Comparative Example 1 | 73.8 | — | 26.2 | 100 |
| Comparative Example 2 | 14.4 | 15.2 | 70.4 | 100 |
| Comparative Example 3 | 25.7 | 58.2 | 16.1 | 100 |

Experimental Example: Evaluation of physical properties of electrode formed using paste composition Each paste prepared in the examples and the comparative examples was applied to a screen printing plate by rolling with a scrapper. The paste was printed on a monocrystalline wafer having an average sheet resistance of 65Ω, the paste being discharged to a caustic line portion of the screen printing plate using a squeezer. The printed wafer was dried at 300° C. for about 20 seconds and baked in a BTU baking furnace at a 6-zone temperature of 940° C. and a belt speed of 250 ipm (inches per minute). After baking, the efficiency (%) of each electrode was calculated. Further, after data was obtained through a dark-IV measurement method, ideality factors n1 and n2 were calculated using a single diode model, thereby obtaining junction quality through the calculation of n2-n1. In addition, contact resistance was measured through a determination of the Corescan potential. The Corescan potential for measuring contact resistance of a silicon wafer was determined using a CoreScan tester (Mechatronic-BV). In the Corescan method, the level of electric current is measured when a metal tip is passed over a silicon substrate to which electric current is applied, and the level of electric current is converted into a Corescan potential.

TABLE 2

|  | Efficiency (%) | n2-n1 | Corescan potential (mV) |
|---|---|---|---|
| Example 1 | 17.96 | 2.97 | 14.04 |
| Example 2 | 17.89 | 2.56 | 12.00 |
| Example 3 | 18.08 | 3.06 | 10.13 |
| Example 4 | 18.02 | 2.81 | 10.41 |
| Comparative Example 1 | 16.88 | 2.05 | 34.25 |
| Comparative Example 2 | 9.12 | 0.34 | 168.22 |
| Comparative Example 3 | 4.24 | Unmeasurable | 154.11 |

As shown in Table 2, electrodes including the paste compositions according to the present embodiment had a high n2-n1 value, thereby providing high efficiency and low contact resistance to a solar cell. On the contrary, electrodes formed of the electrode pastes including glass frit in which the amounts of $Bi_2O_3$ and $TeO_2$ were not in a desired range exhibited considerably low efficiency of a solar cell and high contact resistance.

By way of summation and review, as emitters of solar cells have become thinner to increase efficiency of the solar cell, the solar cell may undergo a shunting phenomenon that can reduce solar cell performance. Also, the area of solar cells has gradually increased to enhance efficiency of the solar cell, which can increase the contact resistance of the solar cell and cause decrease in the efficiency of the solar cell. Further, with an increasing number of wafers having various levels of sheet resistance, the baking temperature may vary extensively. Thus, a paste composition that can secure heat stability in a wide range of baking temperatures is desirable. Moreover, it is necessary to develop a paste composition for solar cell electrodes which minimizes damage to a p-n junction under various levels of sheet resistance, thereby securing stability of the p-n junction while enhancing efficiency of the solar cell.

Embodiments provide a paste composition for solar cell electrodes, which is capable of minimizing damage to a p-n junction at high sheet resistance while reducing contact resistance to enhance efficiency of the solar cell, an electrode prepared using the same, and a solar cell comprising the same.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A paste composition for solar cell electrodes, the paste composition comprising:
    a conductive powder;
    a glass frit; and
    an organic vehicle,
    the glass fit including about 5 wt % to about 55 wt % of $Bi_2O_3$, about 10 wt % to about 40 wt % of $TeO_2$, and a balance of PbO, wherein the $Bi_2O_3$ is the largest component, by wt %, in the glass frit.

2. The paste composition as claimed in claim 1, wherein a sum of $Bi_2O_3$ and PbO ranges from about 20 wt % to about 70 wt % of the glass fit.

3. The paste composition according as claimed in claim 1, wherein PbO is present in an amount of about 10 to about 60 wt % in the glass fit.

4. The paste composition as claimed in claim 1, wherein the glass frit further includes at least one selected from the group of $Al_2O_3$, $ZrO_2$, $P_2O_5$, ZnO, $SiO_2$, $Na_2O$, $B_2O_3$, $Ta_2O_5$, $Fe_2O_3$, $Cr_2O_3$, $Co_2O_3$, $Li_2O$, $Li_2CO_3$, MgO, and $MnO_2$.

5. The paste composition as claimed in claim 1, wherein the glass frit has an average particle diameter (D50) of about 0.1 to about 5 μm.

6. The paste composition as claimed in claim 1, wherein the conductive powder includes at least one selected from the group of silver (Ag), gold (Au), palladium (Pd), platinum (Pt), copper (Cu), chromium (Cr), cobalt (Co), aluminum (Al), tin (Sn), lead (Pb), zinc (Zn), iron (Fe), iridium (Ir), osmium (Os), rhodium (Rh), tungsten (W), molybdenum (Mo), nickel (Ni), magnesium (Mg) and indium tin oxide (ITO).

7. The paste composition as claimed in claim 1, wherein the organic vehicle includes a cellulose polymer, an acrylic copolymer, a polyvinyl resin, a solvent, or a mixture thereof.

8. The paste composition as claimed in claim 1, wherein the paste includes about 60 wt % to about 90 wt % of the conductive powder, about 1 wt % to about 10 wt % of the glass fit, and about 7 wt % to about 30 wt % of the organic vehicle.

9. The paste composition as claimed in claim 1, wherein the additive includes at least one additive selected from the group of dispersants, thixotropic agents, plasticizers, viscosity stabilizers, antifoaming agents, pigments, UV stabilizers, antioxidants, and coupling agents.

10. An electrode prepared from the paste composition as claimed in claim 1.

11. A solar cell including the electrode as claimed in claim 10.

* * * * *